United States Patent
Knoll et al.

(10) Patent No.: US 9,564,549 B2
(45) Date of Patent: Feb. 7, 2017

(54) GERMAINIUM PIN PHOTODIODE FOR INTEGRATION INTO A CMOS OR BICMOS TECHNOLOGY

(71) Applicant: IHP GmbH—Innovations for High Performance Microelectronics/Leibniz-Institut Fur Innovative Mikroelektro, Frankfurt (Oder) (DE)

(72) Inventors: Dieter Knoll, Frankfurt (DE); Stefan Lischke, Frankfurt (DE); Lars Zimmermann, Berlin (DE); Yuji Yamamoto, Frankfurt (DE); Andreas Trusch, Frankfurt (Oder) (DE)

(73) Assignee: IHP GMBH—INNOVATIONS FOR HIGH PERFORMANCE MICROELECTRONICS/LEIBNIZ-INSTITUT FUR INNOVATIVE MIKROELEKTRONIK, Frankfurt (DE)

( * ) Notice: Subject to any disclaimer, the term of this patent is extended or adjusted under 35 U.S.C. 154(b) by 0 days.

(21) Appl. No.: 14/429,131

(22) PCT Filed: Sep. 19, 2013

(86) PCT No.: PCT/EP2013/069511
§ 371 (c)(1),
(2) Date: May 28, 2015

(87) PCT Pub. No.: WO2014/044771
PCT Pub. Date: Mar. 27, 2014

(65) Prior Publication Data
US 2015/0325736 A1    Nov. 12, 2015

(30) Foreign Application Priority Data

Sep. 19, 2012 (DE) .................. 10 2012 216 811
Jan. 31, 2013 (DE) .................. 10 2013 201 644

(51) Int. Cl.
*H01L 31/105* (2006.01)
*H01L 31/0224* (2006.01)
(Continued)

(52) U.S. Cl.
CPC .......... *H01L 31/105* (2013.01); *H01L 31/028* (2013.01); *H01L 31/02327* (2013.01);
(Continued)

(58) Field of Classification Search
CPC ..................................................... H01L 31/105
See application file for complete search history.

(56) References Cited

U.S. PATENT DOCUMENTS 6,352,942 B1    3/2002 Luan et al.
6,635,110 B1    10/2003 Luan et al.
(Continued)

FOREIGN PATENT DOCUMENTS

WO    2009/020433 A1    2/2009

OTHER PUBLICATIONS

Lischke, et al; "Low dark current Ge PIN photodiode for a high-performance, photonic BiCMOS process for radio-over-fiber applications"; Photonics Conference, 2012, IEEE; Sep. 23, 2012; pp. 628-629.
Loh, et al; "Impact of Local Strain From Selective Epitaxial Germanium With Thin Si/SiGe Buffer on High-Performance p-i-n. Photodetectors With a Low Thermal Budget", IEEE Electron Device Letters, IEEE Service Center, New York, NY; Nov. 2007; pp. 984-986.

*Primary Examiner* — Benjamin Sandvik
(74) *Attorney, Agent, or Firm* — Ware, Fressola, Maguire & Barber LLP

(57) ABSTRACT

A diode comprising a light-sensitive germanium region which is totally embedded in silicon and forms with the silicon a lower interface and lateral interfaces, wherein the lateral interfaces do not extend perpendicularly, but obliquely to the lower interface and therefore produce a faceted form.

16 Claims, 2 Drawing Sheets

(51) Int. Cl.
   *H01L 31/0232* (2014.01)
   *H01L 31/028* (2006.01)
(52) U.S. Cl.
   CPC .. *H01L 31/022408* (2013.01); *H01L 31/1055* (2013.01); *Y02E 10/547* (2013.01)

(56) References Cited

U.S. PATENT DOCUMENTS

| | | | |
|---|---|---|---|
| 7,340,709 B1 | 3/2008 | Masini et al. | |
| 8,558,336 B2* | 10/2013 | Su | H01L 31/035281 |
| | | | 257/432 |
| 8,928,107 B2* | 1/2015 | Kim | H01L 31/102 |
| | | | 257/461 |
| 9,042,417 B2* | 5/2015 | Huang | H01L 31/0232 |
| | | | 372/45.01 |
| 9,401,447 B2* | 7/2016 | Okumura | H01L 31/105 |
| 2007/0104441 A1 | 5/2007 | Ahn et al. | |
| 2009/0101909 A1 | 4/2009 | Chen et al. | |
| 2009/0108384 A1 | 4/2009 | Assefa et al. | |
| 2009/0324164 A1* | 12/2009 | Reshotko | G02B 6/1228 |
| | | | 385/14 |
| 2015/0016769 A1* | 1/2015 | Verma | G02B 6/12004 |
| | | | 385/14 |

* cited by examiner

GERMAINIUM PIN PHOTODIODE FOR INTEGRATION INTO A CMOS OR BICMOS TECHNOLOGY

CROSS REFERENCE TO RELATED APPLICATIONS

This application is the U.S. National Stage of International Application Number PCT/EP2013/069511 filed on Sep. 19, 2013 which application claims priority under 35 USC §119 to German Patent Application No. 10 2012 216 811.7 filed on Sep. 19, 2012 and German Patent Application 10 2013 201 644.1 filed on Jan. 31, 2013. All of these applications are hereby incorporated by reference in their entirety.

TECHNICAL FIELD

The invention relates to a diode comprising a germanium region. The invention also relates to a method for producing such a diode.

BACKGROUND OF THE INVENTION

Optical and opto-electronic components produced with a silicon-based technology are key components, for example for optical telecommunications or for optical connections within or between microelectronics circuits. Examples of such components are couplers, waveguides, modulators and photodetectors, in particular.

Modern photodetectors use germanium as a detector material due to its significantly better absorbance compared to silicon in the wavelength range used for optical communication (1.3-1.6 µm). A "PIN diode" ("P" standing for p-doped region, "I" for intrinsic region and "N" for n-doped region) is often used as a detector. Important parameters of the diode are dark current, photocurrent, sensitivity and optical bandwidth. Very fast Ge photodiodes with an intrinsic region width of a few hundred nanometers and with an optical bandwidth of 50 GHz have already been demonstrated.

Such diodes are typically produced by epitaxial growth directly on an SOI substrate, which allows direct coupling of the detector to the waveguide made from the upper monocrystalline Si layer of the SOI structure. The light to be detected can thus be supplied laterally to the diode, which allows the diode to be independently optimized with regard to sensitivity and optical bandwidth.

SUMMARY OF THE INVENTION

According to a first aspect of the invention, a lateral PIN diode contains a light-sensitive germanium region which is totally embedded in silicon and forms with the silicon a lower interface and lateral interfaces, wherein the lateral interfaces do not extend perpendicularly, but obliquely to the lower interface and therefore produce a faceted form. In the diode according to the invention, the germanium region has a portion which is only intrinsically conductive and which extends under an insulating strip disposed on the silicon, the lateral extension of said strip determining the intrinsic region of the diode. Doped germanium and silicon regions laterally adjoin the intrinsically conductive portion of the germanium region and extend laterally from the intrinsic germanium region of the diode to a diode edge defined by an insulator.

The diode of the present invention makes it possible, in preferred embodiments, to provide a lateral PIN photodiode which not only achieves very good parameters, such as low dark currents and high optical bandwidth, in particular, but which also satisfies important requirements for integration into a CMOS or BiCMOS technology, such as limited vertical height and use of the contact and metallization system used in CMOS or BiCMOS processes, in particular self-aligned silicide formation, and with a structure that does not result in any restrictions or changes in cleaning and wet etching steps of the CMOS or BiCMOS process, which must be applied after deposition of the Ge epitaxial layer.

The invention is based on the following ideas:

For monolithic integration of a germanium PIN photodiode in a CMOS or BiCMOS technology, "front end integration" would be advantageous, in which the main steps in the detector production process are carried out before production of the metallization layers of the CMOS or BiCMOS technology, and in which the detector is electrically connected to the electrical components of the CMOS or BiCMOS process (transistors, resistors, etc.) using the contact and metallization layers of the CMOS or BiCMOS process.

Further developments of the diode now allow important requirements for integration into a CMOS or BiCMOS technology to also be met, for example a limited vertical height and use of the contact and metallization system used in the CMOS or BiCMOS process, in particular self-aligned silicide formation. Preferred embodiments of the diode structure according to the invention also make it possible to avoid restrictions or changes in cleaning and wet etching steps of the CMOS or BiCMOS process, which had to be made in the prior art after deposition of the Ge epitaxial layer.

The diode according to the invention can also be produced as embodiments with a large optical bandwidth. Steep doping profiles are an important requirement for such a large optical bandwidth of the photodiode. However, the diffusion coefficients of some dopants (phosphorus, for example) are higher in germanium than in silicon. In preferred embodiments, the structure of the PIN diode according to the invention allows formation of a diode structure in which only the intrinsic region consists substantially of germanium, whereas silicon is used as far as possible to form the doped regions.

Preferred embodiments of the diode and their associated advantages shall now be described.

The germanium region preferably tapers from the lower interface with increasing distance from the lower interface. In this embodiment, the lateral interfaces are preferably produced by epitaxial growth of the germanium region on a (100) silicon base selectively with respect to an insulating layer.

A total height of the diode above the lower interface is preferably 700 nm at most, or 500 nm at most in particularly preferred embodiments, said height including a maximum thickness of the germanium region above the lower interface and a thickness of a portion of the silicon layer above the germanium region. The requirement mentioned above, according to which the detector should not exceed a certain total height in order to ensure contact heights for the diode that are not significantly less than the heights of the transistor contact heights of the CMOS or BiCMOS process, is satisfied sufficiently well in most cases when the overall height of the detector is no more than 500-700 nm, measured from the lower interface.

However, this requirement may mean a significant limitation with regard to the diode dark current level that can be achieved, given that the defect density of germanium layers produced by hetero-epitaxy on silicon substrate decreases strongly with increasing thickness of the germanium layer. A germanium layer with a thickness of only 500 nm may have a dislocation density that is around 100 times higher compared to a 4.5 µm thick layer, for example.

In various alternative embodiments, the thickness of the portion of the silicon layer portion above the germanium region, measured from the planar, facetless part of an upper interface between the germanium region and the silicon, has a value ranging between 20 and 150 nm.

A metal silicide layer which can be connected to other contact structures is preferably formed on the doped silicon regions. The low contact impedance to the doped regions that can be achieved in this way is of major importance for very fast photodiodes.

Using the insulating strip even allows self-aligned silicide formation similar or even identical to that which is typically used for the transistors in CMOS or BiCMOS processes. Depending on the metal used, silicide formation directly on germanium is made significantly more difficult or even impossible, unfortunately, when it is performed simultaneously with the silicide formation in the CMOS or BiCMOS process.

Spacers preferably adjoin the insulating strip laterally and define a spacing between the insulating strip and the metal silicide layer.

The diode according to the invention, or any of its embodiments as described herein, is advantageously used as a photodiode, in particular in an optoelectronic component which has at least one monolithically integrated light guiding component in addition to the diode. The light guiding component is a waveguide, for example, made of silicon and forming the lower interface with the germanium region of the diode.

BRIEF DESCRIPTION OF THE DRAWINGS

The features and advantages of the PIN photodiode according to the invention shall now be described in more detail reference to the attached Figures and with a description of further embodiments.

DETAILED DESCRIPTION

Figure 1:
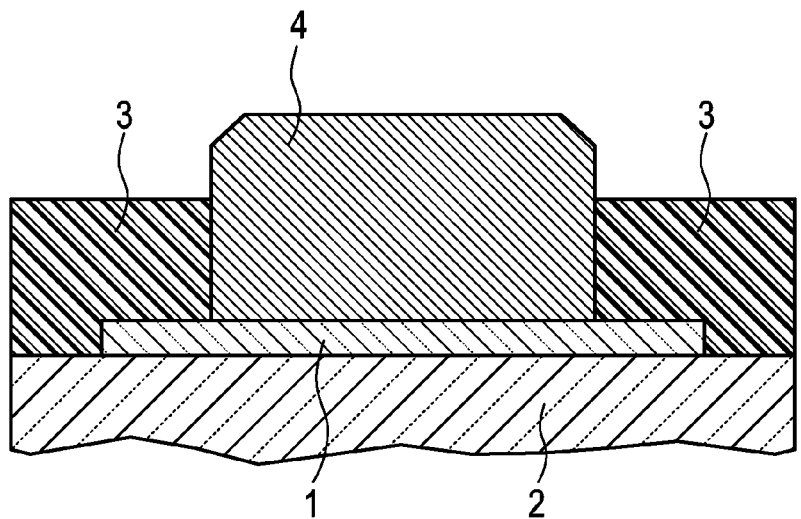
FIG. 1 shows a first stage of an example of a process for producing an embodiment of a diode structure.

FIGS. 1 to 6 illustrate, with schematic cross-sectional views in different stages of the process, an example of a process for producing an embodiment of the PIN photodiode according to the invention, and they also illustrate the features of such a PIN photodiode. All the Figures show structural cross-sections perpendicular to the direction of incidence of the light.

An embodiment of a lateral PIN photodiode according to the invention shall firstly be described below with reference to FIGS. 4 and 6.

On a monocrystalline waveguide 1, produced on a silicon dioxide layer 2, there is a germanium layer 5 which is covered laterally and above by a silicon layer 7. An important aspect is the oblique edge of a lateral interface 6 formed by the germanium layer 5 and the silicon layer, which is referred to in the following as a germanium-silicon interface, and the formation of which shall be described further below. The entire diode structure is laterally enclosed by an insulator layer 3, preferably by a silicon oxide layer. The diode structure is covered with an insulating strip 8, which, as explained in more detail below, allows production of an intrinsic germanium region 5a which is self-aligned with p- and n-doped regions 9 and 10. Lateral insulator layer spacers 11 are optional. The benefit they provide is to increase reliability in preventing undesired diode leakage currents which would occur if the metal silicide layer 12 formed on the p- and n-doped regions 9 and 10 comes into contact with the intrinsic region 5a.

An example of a process for producing the PIN photodiode as just described shall now be described with reference to all the Figures.

FIG. 1 shows a first stage of an example of a process for producing an embodiment of a diode structure. In this stage, selective epitaxial growth has resulted in a germanium layer 4 being formed in a window in an insulator layer 3. In this example, the insulator layer is a silicon oxide layer. The germanium layer 4 and also a portion of the insulator layer 3 lie on a previously produced monocrystalline silicon waveguide 1 located on a silicon oxide layer 2. The thickness of the germanium layer 4 may be considerably thicker here than the desired final thickness of the germanium region of the finished photodiode. Facet formation on the upper side of germanium layer 4, typical for selective Ge growth on (100) oriented silicon, is indicated in FIG. 1 by oblique edges. The thickness of insulator layer 3 above waveguide 1 is chosen such that it corresponds to the desired total detector height, compatible with CMOS and BiCMOS.

Figure 2:
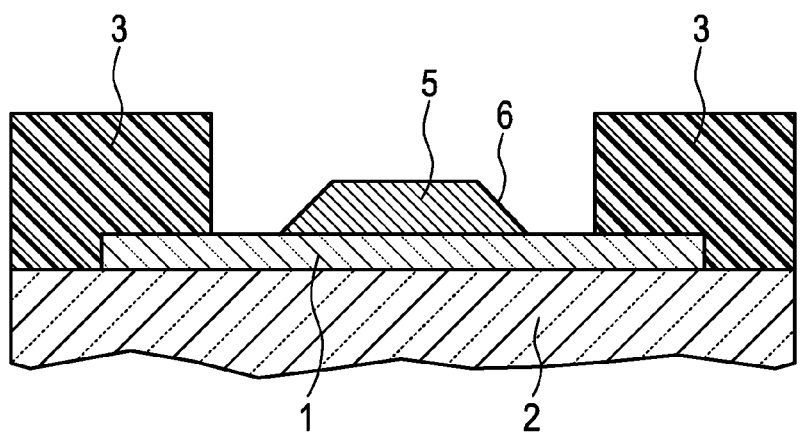
FIGS. 2-5 show the second to fifth stage of the process for producing the embodiment of the diode structure.

FIG. 2 shows a second stage in production of the diode structure embodiment. Many chemicals that are used in the CMOS or BiCMOS process for cleaning or etching steps do not have sufficient selectivity to germanium, i.e., they strongly attack the grown germanium layer, which can greatly complicate the integration of the production process for the germanium PIN photodiodes into the CMOS or BiCMOS process. A gas phase etch-back process is therefore used as an alternative solution in the present embodiment. This gas phase etch-back process is already known per se, namely from the publication by Y. Yamamoto et al, in *Thin Solid Films*, Vol. 520 (2012) pp. 3216-3221. It can be carried out in the same production plant immediately after producing germanium layer 4 and requires no additional cleaning steps prior to the subsequent steps for completing the photodiode.

FIG. 2 shows the diode structure after such a gas phase-etch-back process. The etching process is controlled in such a way that the final height of the processed germanium layer, marked with reference sign 5 in the Figures, over the waveguide is set. In the etching process, a characteristic structure having a lateral facet 6 is formed, as indicated in FIG. 2. As described in Y. Yamamoto et al, *Thin Solid Films*, Vol. 520 (2012) pp. 3216-3221, the process sequence "depositing a relatively thick germanium layer" and "subsequent etching back" allows the production of "thin" Ge layers having a lower defect density than can otherwise be achieved for "thicker" layers. This approach is important for achieving a low dark current level in the photodiodes.

Figure 3:
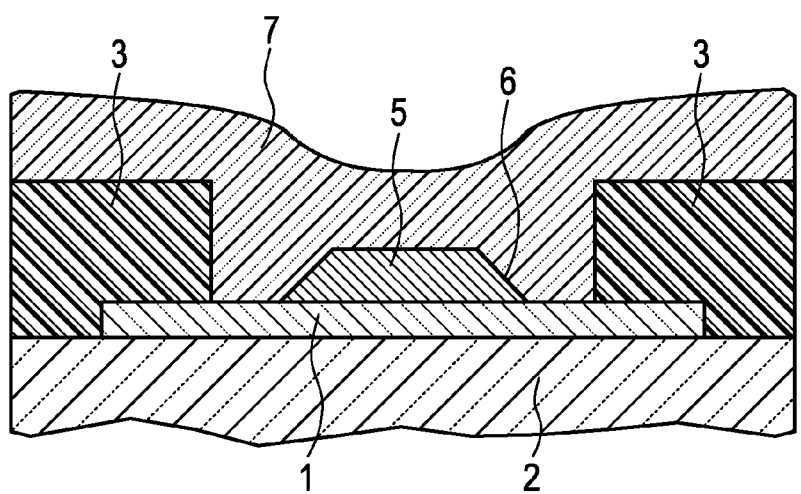
Figure 4:
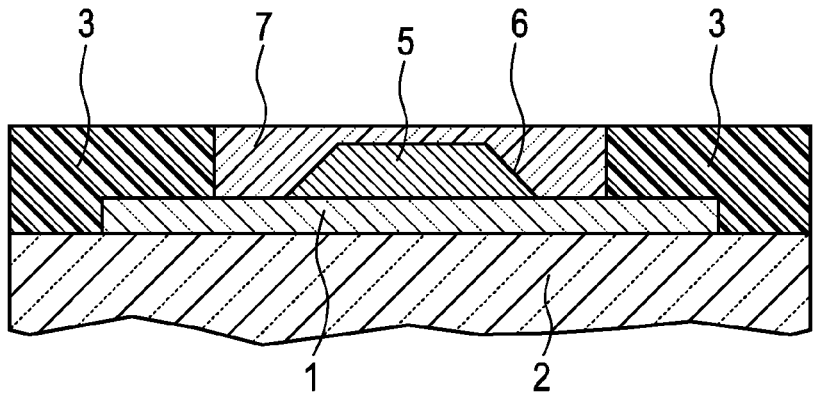

FIGS. 3 and 4 show a third and a fourth stage in production of the embodiment of the diode structure. FIG. 3 shows the diode structure after deposition of a silicon layer 7 by non-selective silicon epitaxy. FIG. 4 shows the diode structure after subsequent planarization by chemical-mechanical polishing (CMP). It is important that after these steps of the process, the germanium region of the diode is completely enclosed by silicon. This allows unrestricted application of the normal cleaning and wet etching processes of CMOS or BiCMOS technology and use of the same metal silicide for CMOS or BiCMOS components and photodiodes.

Figure 5:
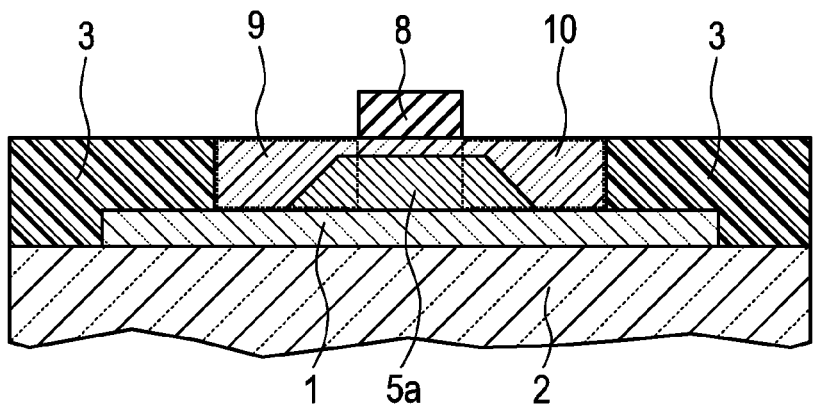

FIG. 5 shows, as a fifth stage in the production of this embodiment of the diode structure, a phase during self-aligned production of a PIN structure with the aid of an insulating strip 8. The thickness of the latter is chosen such that no doping whatsoever is introduced under the strip during subsequent implantation of p- and n-regions 9 and 10. In FIG. 5, this is graphically indicated by the p- and n-regions being darker than a region 5a lying between the latter and under insulating strip 8. In this way, inner edges of resist masks (not shown) used for p- and n-implantation are positioned directly on insulating strip 8, without variations in the alignment of the resist masks with insulating strip 8 resulting in variations in the desired width of the intrinsic germanium region 5a. The width of the intrinsic germanium region can thus be adjusted very precisely, which is very important for the optical bandwidth.

It is also important that not only the width of the intrinsic germanium region can be adjusted with the width of insulating strip 8, but also the ratio between doped germanium and silicon regions, which can be then exploited for optimizing the bandwidth of the diodes.

Figure 6:
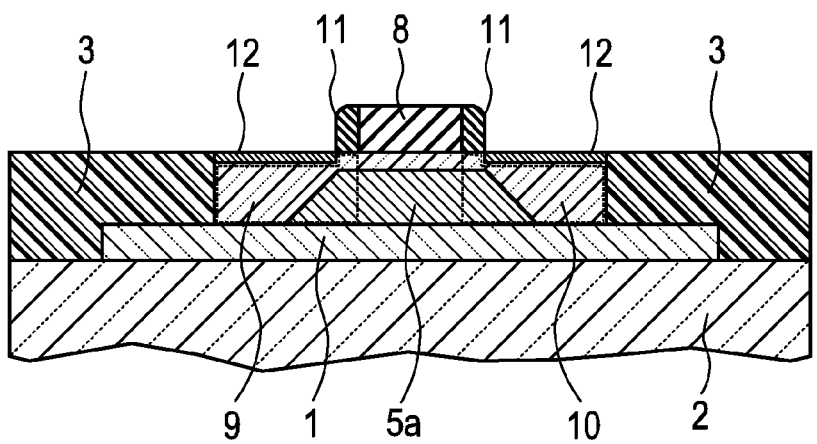
FIG. 6 shows a sixth stage of the process for producing the embodiment of the diode structure, and at the same time the completed embodiment of the diode structure according to the invention.

FIG. 6 shows, as the sixth stage in production of this embodiment of the diode structure, the final diode structure before production of diode contacts. A metal silicide layer 12 has been produced by self-aligned formation, making optimal use of insulating layer spacers 11 above p- and n-regions 9 and 10. This makes it possible to achieve low contact impedances, which in turn are beneficial for achieving high optical bandwidth.

With the structure achieved here, the contacts normally used in CMOS or BiCMOS processes (e.g. tungsten "plugs" (not shown)) can be shared to some extent.

The invention claimed is:

1. A lateral PIN diode, comprising
a light-sensitive germanium region which is totally embedded in silicon and forms with the silicon a lower interface and lateral interfaces, wherein the lateral interfaces do not extend perpendicularly, but obliquely to the lower interface and therefore produce a faceted form,
wherein the germanium region has a portion which is only intrinsically conductive and which extends under an insulating strip disposed on the silicon, the lateral extension of said strip determining the intrinsic region of the diode, and
wherein doped germanium and silicon regions laterally adjoin the intrinsically conductive portion of the germanium region and extend laterally from the intrinsic germanium region of the diode to a diode edge defined by an insulator.

2. The diode according to claim 1, wherein the germanium region tapers from the lower interface with increasing distance from the lower interface, the lateral interfaces preferably being produced by epitaxial growth of the germanium region on a silicon base selectively with respect to an insulating layer.

3. The diode according to claim 2, wherein a total height of the diode above the lower interface is 700 nm at most, said height including a maximum thickness of the germanium region above the lower interface and a thickness of a portion of the silicon layer above the germanium region.

4. The diode according to claim 3, wherein the total height is 500 nm at most.

5. The diode according to claim 4, wherein the thickness of the portion of the silicon layer portion above the germanium region, measured from the planar, facetless part of an upper interface between the germanium region and the silicon, ranges between 20 and 150 nm.

6. The diode according to claim 5, wherein a metal silicide layer is formed on the doped silicon regions.

7. The diode according to claim 6, wherein spacers laterally adjoin the insulating strip and define a spacing between the insulating strip and the metal silicide layer.

8. An opto-electronic component, comprising a diode according to claim 1 and a light guiding component monolithically integrated with said diode.

9. The opto-electronic component according to claim 8, wherein the light guiding component is a waveguide made of silicon and forming the lower interface with the germanium region of the diode.

10. The diode according to claim 1, wherein a total height of the diode above the lower interface is 700 nm at most, said height including a maximum thickness of the germanium region above the lower interface and a thickness of a portion of the silicon layer above the germanium region.

11. The diode according to claim 10, wherein the total height is 500 nm at most.

12. The diode according to claim 10, wherein the thickness of the portion of the silicon layer portion above the germanium region, measured from the planar, facetless part of an upper interface between the germanium region and the silicon, ranges between 20 and 150 nm.

13. The diode according to claim 1, wherein a metal silicide layer is formed on the doped silicon regions.

14. The diode according to claim 13, wherein spacers laterally adjoin the insulating strip and define a spacing between the insulating strip and the metal silicide layer.

15. An opto-electronic component, comprising a diode according to claim 2 and a light guiding component monolithically integrated with said diode.

16. The opto-electronic component according to claim 15, wherein the light guiding component is a waveguide made of silicon and forming the lower interface with the germanium region of the diode.

* * * * *